United States Patent [19]
Tschudin et al.

[11] Patent Number: 5,828,216
[45] Date of Patent: Oct. 27, 1998

[54] GATED RF PREAMPLIFIER FOR USE IN PULSED RADIOFREQUENCY ELECTRON PARAMAGNETIC RESONANCE AND MRI

[75] Inventors: Rolf Gottfried Tschudin, Kensington; Ramachandran Murugesan; Murali K. Cherukuri, both of Rockville; James B. Mitchell, Damascus, all of Md.; Sankaran Subramanian, Madras, India

[73] Assignee: The United States of America as represented by the Department of Health and Human Services, Washington, D.C.

[21] Appl. No.: 699,383

[22] Filed: Aug. 19, 1996

[51] Int. Cl.$^6$ .................................................. G01V 3/00
[52] U.S. Cl. ........................................ 324/322; 324/300
[58] Field of Search .................... 324/322, 318, 324/314, 307, 309, 300; 128/653.5

[56] References Cited

U.S. PATENT DOCUMENTS

| | | | |
|---|---|---|---|
| 4,700,138 | 10/1987 | Shimazaki et al. | 324/322 |
| 4,714,886 | 12/1987 | Halpern | 324/316 |
| 4,733,182 | 3/1988 | Clarke et al. | 324/301 |
| 4,994,746 | 2/1991 | Panosh . | |
| 5,194,825 | 3/1993 | Zametzer et al. . | |
| 5,347,222 | 9/1994 | Fox et al. | 324/322 |
| 5,374,895 | 12/1994 | Lee et al. | 324/322 |
| 5,387,867 | 2/1995 | Bourg et al. | 324/316 |
| 5,397,562 | 3/1995 | Mason et al. | 424/9 |
| 5,433,196 | 7/1995 | Fiat | 128/632 |
| 5,444,337 | 8/1995 | Ogawa et al. . | |
| 5,494,030 | 2/1996 | Swartz et al. | 128/632 |

FOREIGN PATENT DOCUMENTS

| | | | |
|---|---|---|---|
| 0 394 504 | 10/1990 | European Pat. Off. | G01R 33/46 |
| A3726051 | 2/1989 | Germany | G01N 24/00 |
| 2 221 040 | 1/1990 | United Kingdom | G01R 24/10 |
| 92/01235 | 1/1992 | WIPO | G01R 33/46 |

OTHER PUBLICATIONS

*Journal of Magnetic Resonance*, Series B., vol. 102, No. 1, 1 Aug. 1993, pp. 112–115, Bourg J. et al., "Radiofrequency FT EPR Spectroscopy and Imaging".

*Review of Scientific Instruments*, vol. 65, No. 8, 1 Aug. 1994, pp. 2500–2504, Pohida T. J. et al., "High–Speed Digitizer/Averager Data–Acquisition System for Fourier Transform Electron Paramagnetic Resonance Spectroscopy".

*Review of Scientific Instruments*, vol. 58, No. 9, Sep. 1987, pp. 1709–1723, R. W. Quine et al., "Pulsed EPR Spectrometer".

*Measurement Science and Technology*, vol. 1, No. 8, 1 Aug. 1990, pp. 720–724, Lovy D. et al., "A New Pulse Generator for Pulsed ESR".

*Measurement Science and Technology*, vol. 3, No. 3, 1 Mar. 1992, pp. 299–301, Momo F. et al., "Programmable Pulse Generator for EPR Imaging".

*Journal of Magnetic Resonance*, Series A, vol. 108, No. 1, May 1994, pp. 71–81, Rinard G. A. et al., "Relative Benefits of Overcoupled Resonators VS Inherently Low–Q Resonators for Pulsed Magnetic Resonance".

(List continued on next page.)

Primary Examiner—Louis M. Arana
Attorney, Agent, or Firm—Townsend and Townsend and Crew, LLP

[57] ABSTRACT

A gated RF preamplifier used in system for performing pulsed RF FT EPR spectroscopy and imaging or MRI. The RF preamplifier does not overload during a transmit cycle so that recovery is very fast to provide for ultra-fast data acquisition in an ultra-fast excitation subsystem. The preamplifier includes multiple low-gain amplification stages with high-speed RF gates inserted between stages that are switched off to prevent each stage from overloading during the transmit cycle.

8 Claims, 9 Drawing Sheets

OTHER PUBLICATIONS

*Journal of Magnetic Resonance*, vol. 84, No. 2, 1 Sep. 1989, pp. 296–308, Prisner T. et al., "ESR with Stochastic Excitation".

*Berichte der Bunsen–Gesellschaft*, vol. 78, No. 11, 1974, pp. 1168–1179, D. Ziessow et al., "Hadamard–NMR–Spektroskopie".

"Nuclear Magnetic Resonance Imaging Apparatus Using Chirp Tracking System," Yokokawa Medical System K.K. (Takeuchi), 60–44880, Mar. 11, 1985 *Patent Abstracts of Japan*.

"Atomic Memory," Brewer et al., *Scientific American*, Dec. 1984, pp. 50–57.

"Selective Compression of Frequency Modulated Pulses with the Aid of the Spin Echo Effect," Dovator et al., *Sov.Phys.Tech.Phys.*, 32(11), Nov. 1987, pp. 1308–1311.

"Imaging Radio Frequency Electron–Spin–Resonance Spectrometer with High Resolution and Sensitivity for in vivo Measurements," Halpern et al., *Rev. Sci. Instrum.* 60(6), Jun. 1989, pp. 1040–1050.

"Improved Schemes for Refocusing with Frequency–Modulated Chirp Pulses," Ermakov et al., *Journal of Magnetic Resonance*, Series A 103 (1993) pp. 226–229.

"A Radiofrequency ESR Spectrometer for in vivo Imaging," Brivati et al., *Journal of Magnetic Resonance*, 92, (1991), pp. 480–489.

"Electron Paramagnetic Resonance Spectrometer for Three–Dimensional in vivo Imaging at Very Low Frequency," Alecci et al., *Rev. Sci. Instrum.* 63(10), Oct. 1992, pp. 4263–4270.

Cory & Ritchey, "A Simple Pulsed Amplifier Controller," *J. Magn. Reson.* 72, 334–336 (1987).

Forbes, "Fast 35–GHz Time–Resolved EPR Apparatus," *Rev. Sci. Instrum.*, 64(2), 397–401 (1993).

Forbes, et al., "Simple Modification of Varian E–Line Microwave Bridges for Fast Time–Resolved EPR Spectroscopy," *Rev. Sci. Instrum.* 62(11), 2662–2665 (1991).

Callaghan et al., "Pulsed Gradient Spin–Echo ESR," *J. Magn. Reson.*, Series A, 111, 127–131 (1994).

Philips Semiconductors, "NE/SA630 Single Pole Double Throw (SPDT) Switch," product specification (1991).

FIG. 2E. Q-SWITCHING

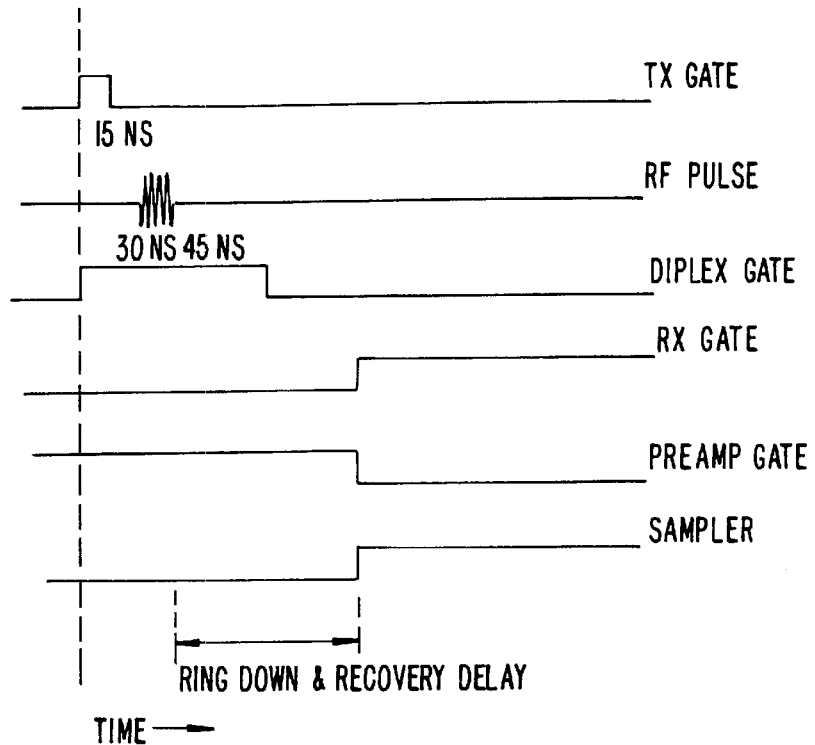
FIG. 3.
| | | | 0 | 0 | | 0 |
FIG. 4A.
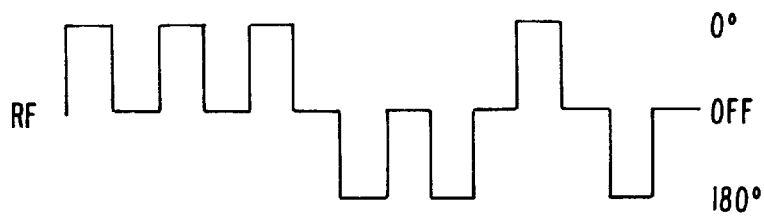
FIG. 4B.

GATED RF PREAMPLIFIER FOR USE IN PULSED RADIOFREQUENCY ELECTRON PARAMAGNETIC RESONANCE AND MRI

BACKGROUND OF THE INVENTION

This invention describes a fast response pulsed Radiofrequency (RF) Electron Paramagnetic Resonance (EPR) spectroscopic technique for in-vivo detection and imaging of exogenous and endogenous free radicals, oxygen measurement and imaging and other biological and biomedical applications.

The main emphasis is the use of low dead-time resonators coupled with fast recovery gated preamplifiers and ultra fast sampler/summer/processor accessory. Such a spectrometer will be practical in detecting and imaging with high resolution, free radicals possessing narrow line widths. This method avoids factors compromising the imaging speed and resolution inherent in the existing Continuous Wave (CW) EPR imaging methods, where modulation and saturation broadening and artifacts of object motion are problems.

It is also possible to perform Fourier imaging and hence to produce image contrasts based on relaxation when using special narrow line free radical probes.

The response of tumors to radiation therapy and chemotherapeutic agents depends upon the oxygen tension. Hence, for an effective cancer therapy, measurement of molecular oxygen in tumors is vital1. Also in general medicine measurement of the oxygen status of ischemic tissue in circulatory insufficiency, be it acute as in stroke or myocardial infarction, or chronic as in peripheral vascular disease associated with numerous diseases such as diabetes, hyperlipedimias, etc., becomes an important tool for assessment and treatment of diseases. Although a variety of techniques are available for measuring oxygen tension in biological systems, polarographic technique is perhaps the most widely used one in clinical applications. However, this is an invasive technique. Besides patients' discomfort, the tissue damage caused by the probe electrodes leads to uncertainty in the values measured, especially so at low oxygen concentration (<10 mm Hg).

Magnetic Resonance Imaging (MRI) enjoys great success as a non invasive technique. NMR imaging, based on the perfluorinated organic compounds, has been used to study blood oxygenation of animal brains. Binding of oxygen to hemoglobin is also used in MRI of human brains to monitor oxygenation changes. However, these techniques lack sufficient sensitivity for routine applications.

Overhauser magnetic resonance imaging (OMRI), based on the enhancement of the NMR signal due to the coupling of the electron spin of an exogenously administered free radical with the water protons, is also attempted for in-vivo oxymetry. Here again the sensitivity is limited, since the organic free radicals used have low relaxivity since they don't possess the free sites for water binding as in the case of gadolinium based contrast agents. The Gd based contrast agents, however, have too short relaxation times for efficient spin polarization transfer. On the other hand, EPR oxymetry is very sensitive compared to MRI or OMRI for oxygen measurements, since it is based on the direct dipolar interaction of the paramagnetic oxygen molecule with the free radical probe.

EPR is generally performed at microwave frequencies (9 GHz). The use of microwave frequency results in substantial tissue heating, and, unfortunately, severely limits tissue penetration. Low frequency EPR has been attempted to achieve better tissue penetration. All of these studies but for the last cited one (from this lab) are done using Continuous Wave (CW) method.

Although low frequency EPR offers the potential for greater in-vivo tissue penetration, its use in continuous wave-based methods is severely limited by lack of sensitivity resulting from the physically imposed Boltzmann factor. Furthermore, sensitivity enhancement by signal averaging as done with CW methods may not be effective, since CW methods are band limited. Pulse EPR techniques, however, as presented in this application, utilize to advantage the very short electron relaxation times to enhance the signal to noise ratio in a very short time, which immediately leads to speed and sensitivity advantage in pulse EPR detection and imaging.

Further, the absence of any modulation in the FT method leads to true line widths, whereas in the CW methods finite modulation can, in the case of narrow lines, lead to artifacts and, therefore, severely limits the resolution achievable. Power saturation is another factor that extremely limits the resolution when detecting and imaging narrow line systems. Also for in vivo studies, any movement of the subject being studied poses severe problems in CW methods. Further, relaxation weighted imaging for contrast mapping is feasible mainly with the pulsed methods. Most of these advantages of pulse techniques over CW method are well established in MRI.

Application of pulse techniques to EPR has serious limitations. The very advantage of short relaxation time, which can in principle lead to virtual "real time" imaging, poses a challenge to the state of the art electronics for ultra fast excitation and data acquisition.

Additionally, existing RF amplifiers utilize a low noise preamplifier followed by frequency conversions, gating circuits, variable gain intermediate frequency amplification and finally by detection or digitization of the FID.

Due to the time shared operation between the transmitter and receiver, a large input signal appears at the preamplifier input during the transmit cycle. Existing preamplifiers will overload the transmit cycle and will take a finite time to recover from such an overload. This recovery period, usually referred to as receiver dead time, causes the loss of valuable signal information in FID which is not detected during the dead time.

Instrumental dead time problems become very severe, especially at low frequencies, since the ringing time constant, $t=2Q/w$ (where Q is the resonator quality factor and w is the carrier frequency), allows acquisition of signals only after a significant interval after excitation which can lead to loss of sensitivity.

SUMMARY OF THE INVENTION

The present invention is a gated RF preamplifier that is suitable for use in a pulsed EPR FT imaging or and spectroscopy system that includes an excitation system for forming 20 to 70 nanoseconds RF excitation pulses of about 200 to 400 MHz. The gated preamplifier functions as the front end of a gated data acquisition system with very short dead time, and amplifies EPR response signals. A pulse sequence with a repetition rate of about 1 to 5 microseconds can be sampled and summed to provide a signal having a high signal to noise ratio.

According to one aspect of the invention, a plurality of amplification stages are coupled by high-speed RF switches controlled by a preamplifier gate signal. When gated on, the amplifier operates as a normal preamplifier with the switches introducing a small but negligible loss of signal between the stages. When gated off, the attenuation of the switches prevents any stage from going into nonlinear overload during transmit cycles.

According to another aspect of the invention, the attenuation of each open gate greatly exceeds the gain of each amplification stage.

According to another aspect of the invention, the output of each preceding stage is coupled to the inverting input of a following stage to reduce transients caused by switching.

Other advantages and features of this invention will be made apparent from the following drawings and descriptions.

BRIEF DESCRIPTION OF THE DRAWINGS

FIGS. 2E–F are schematic diagrams of a Q-circuit and an equivalent Q-circuit, respectively, to be utilized in the resonator of the preferred embodiment;

FIG. 3 is a timing diagram relating to the operation of the preferred embodiment;

FIGS. 4A–B are timing diagrams for using the system to implement a stochastic excitation scheme.

DESCRIPTION OF THE PREFERRED EMBODIMENT

Figure 1:
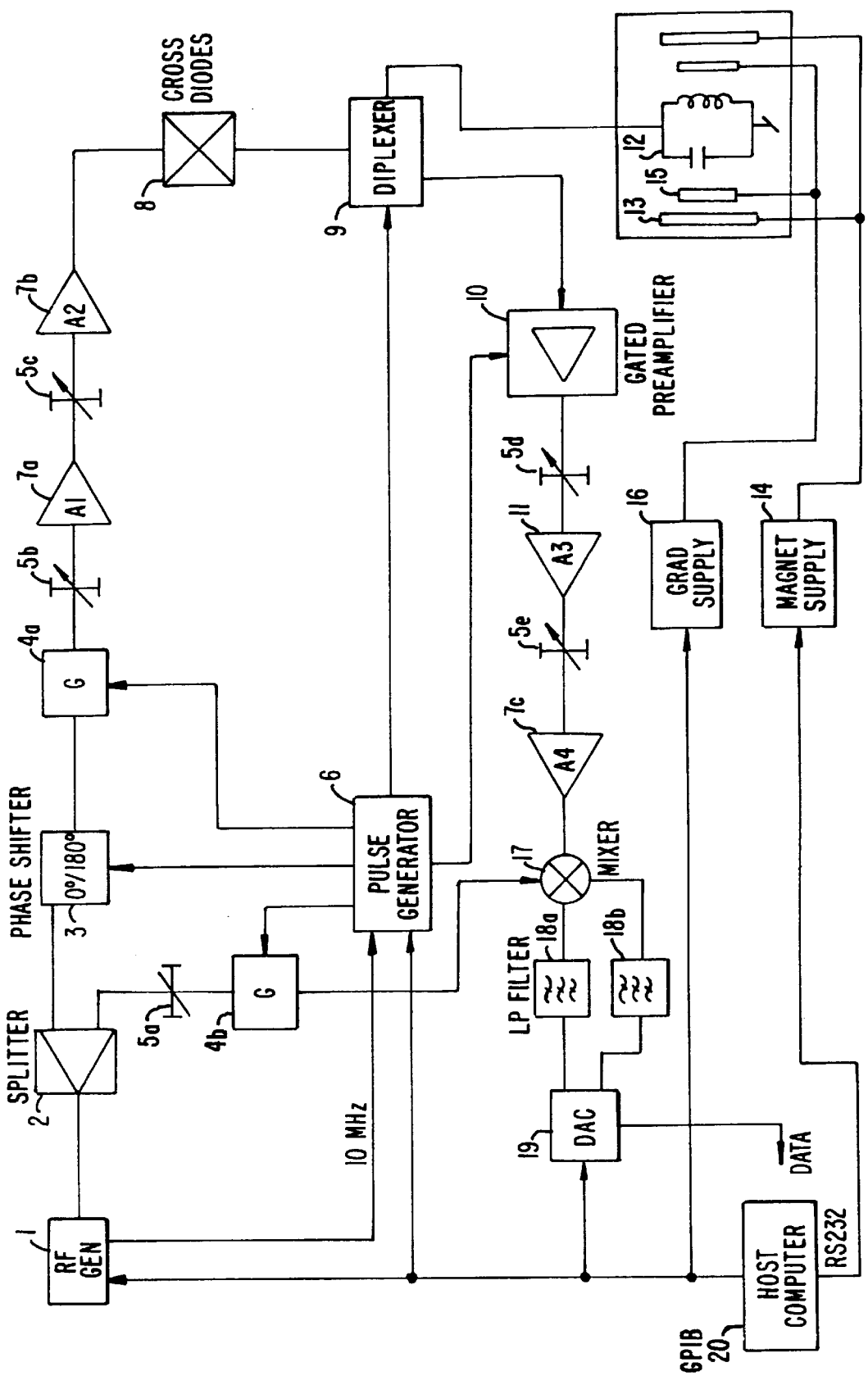
FIG. 1 is an overall block diagram of the spectrometer and imager.

FIG. 1 is a block diagram of the spectrometer/imager. RF power from a Hewlett-Packard (Palo Alto, Calif.) signal generator model HP8644A, 1 is split by a two way-zero degree power splitter (model ZSC-2-1W, Minicircuits, Brooklyn, N.Y.) 2 into two ports, one serving the reference arm and the other the transmitter side. The reference side is gated using RF gate 4b. The required gate timing is provided by a cluster of four Digital Delay Generators (model 535, Stanford Research Systems, Sunnyvale, Calif.) 6. For synchronization, the first of the delay generators utilizes the system clock generated by the RF signal generator 1 (10 MHz). Thereby the jitter of the delay outputs is made less than 25 ps rms. The time base drift between the various delay generators is eliminated by using the reference output of the first DG535 to start the other DG535's.

An appropriate level of reference signal for signal mixing is selected using the variable attenuator 5a.

The other arm of the splitter is directed through a 0/180° phase shifter 3 which can be software controlled using timing pulses from 6. The transmitter pulse is gated through 4a and further amplified by a home made RF amplifier 7a and further amplified by a power amplifier 7b. The optimization of the RF power level is accomplished using a set of attenuators 5b and 5c. The amplified pulses are coupled with the diplexer T/R switch 9 through a pair of crossed diodes 8. The diplexer switch 9 receives the timing signal from 6 and the RF pulse is delivered to the resonator 12 (vide infra).

The magnetic induction response from the object in the resonator is first taken through a specially designed gated preamplifier 10 with a low noise high gain (45 dB) capability and a very short saturation recovery time. The preamplifier gate switching is also controlled by 6. The output of the preamplifier is further amplified using amplifiers 11 and 7c with suitable attenuation in between by attenuators 5d and 5e to avoid saturation.

The reference signal from 4b and the amplified induction signal from 7c are mixed using a double balanced quad mixer 17. The real and imaginary parts are passed through two identical low pass filters 18a and 18b before sampling using a specially designed ultra fast sampler/summer/averager 19. The averaged signal is processed in a Silicon Graphics computer 20 which also controls the overall spectrometer/imager as shown by the bus connection in FIG. 1.

The resonance condition is set by changing the current in the DC magnet 13 by the power supply 14 which is addressed by the computer.

For imaging, the spatial/spectral distribution of the spin is frequency encoded by using a set of 3 axes orthogonal field gradient coils 15. The gradient steering is done by software control of the gradient power supply 16. The overall process of generating the image/spectrum is summarized in FIG. 5.

The various components/modules depicted in FIG. 1 will now be described. In the preferred embodiment, the RF signal generator 1 is a Hewlett Packard model 8644A—Synthesized Signal Generator and the splitter 2 is a Minicircuits ZSC-2-1W (1–650 MHz).

Figure 2A:
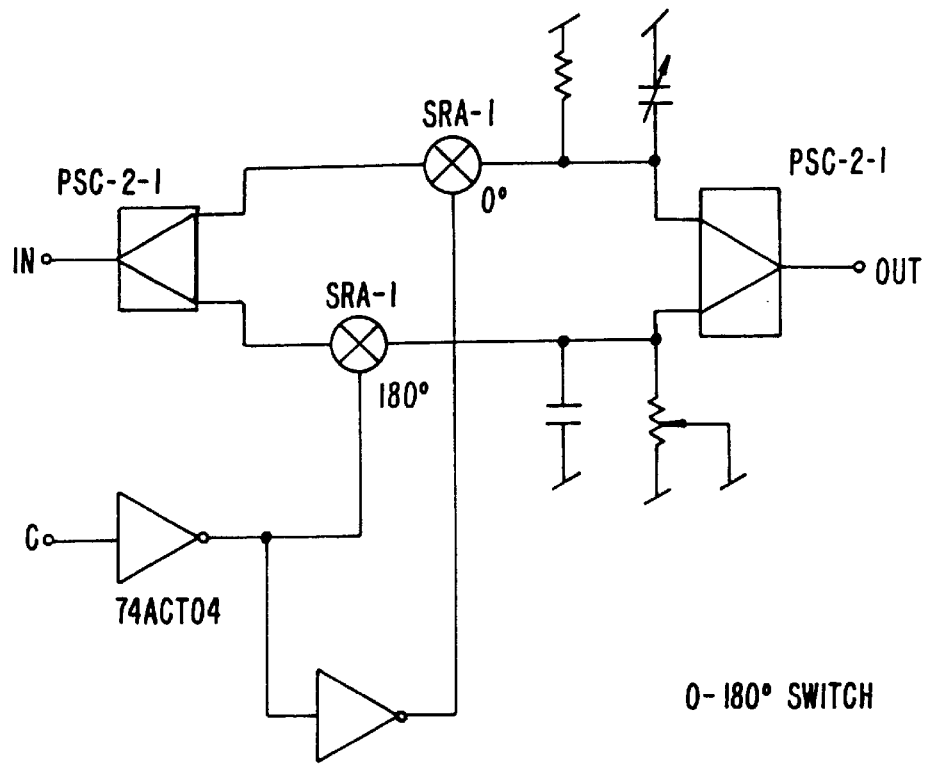
FIG. 2A is a schematic diagram of the phase-shifter used in a preferred embodiment.

The phase-shifter 3 is depicted in FIG. 2A and has been designed and built for the removal of systematic noise. A gating pulse C provided by the pulse generator may have either negative polarity (to induce a 180° phase shift) or positive polarity (to induce a 0° phase shift) where the polarity is controlled by the host computer 20.

RF from the transmitter can, despite a good isolation between the Tx and Receiver provided by the diplexer and the various gatings, leak into the receiver. This leakage can arise from pulse breakthrough while the transmitter is on and/or direct radiation into the receiver from within the spectrometer's electronics. This results in unwanted dc output from quad mixer 17. If uncorrected this can lead to large dc bias and result in spurious spike at zero frequency upon Fourier Transformation.

With the phase shifter set at 0 phase a group of FIDs, say 1000, is accumulated. Then the phase of the RF pulse is changed by 180 by a pulse given from the pulse generator 6 and another 1000 FIDs are accumulated. The resultant FID signals are unaffected, except for the change in sign and hence these are subtracted from the previous group leading to a total collection 2000 FIDs. The unwanted dc biases, from the RF leakage and the amplifiers' drift, and other systematic noises do not change in sign and hence they get subtracted.

Figure 2C:
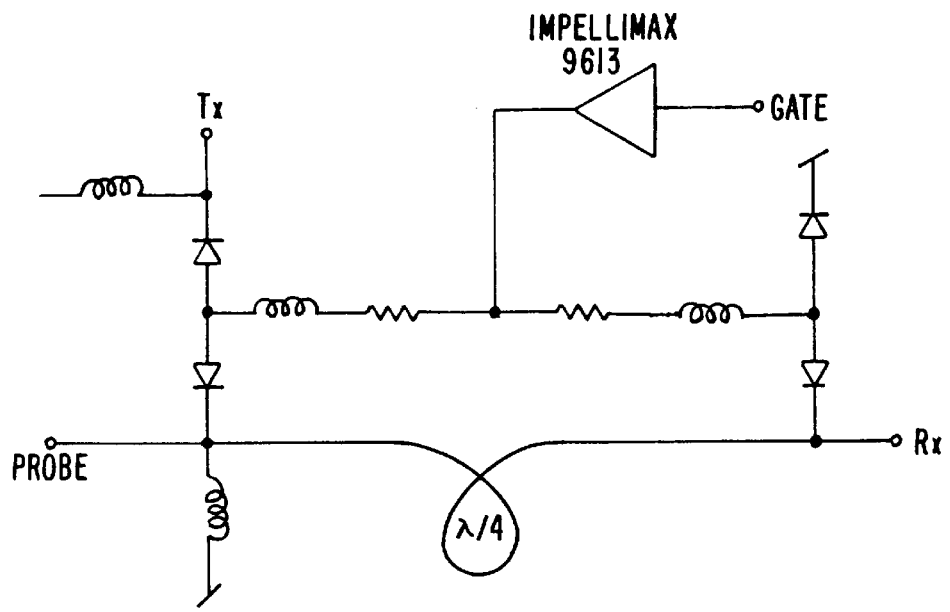
FIG. 2C is a schematic diagram of the diplexer used in a preferred embodiment.
Figure 2B:
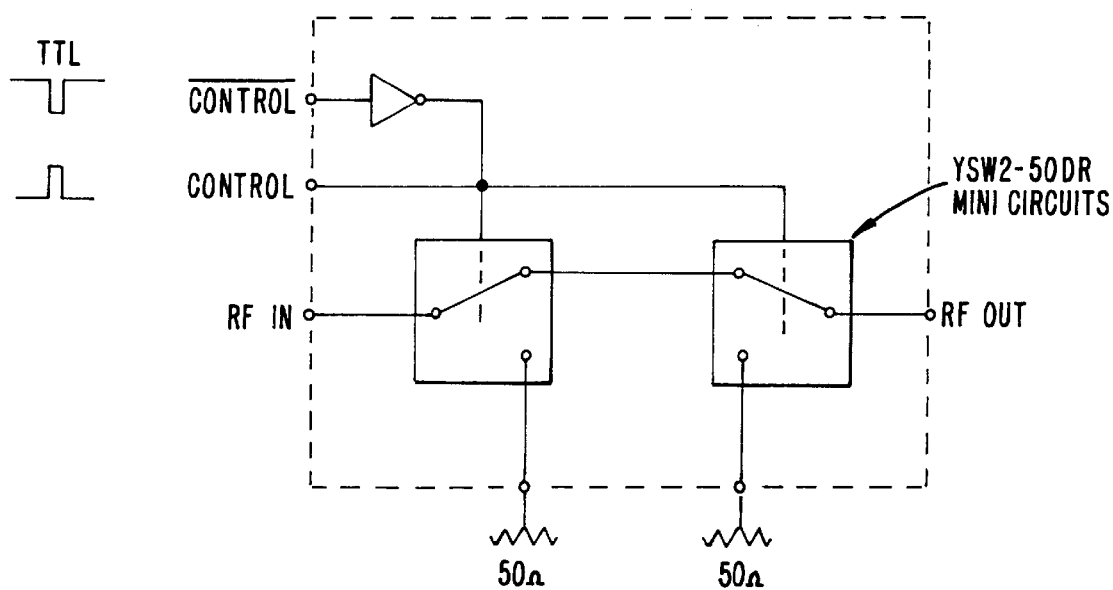
FIG. 2B is a schematic diagram of the high-speed gates used in a preferred embodiment.

The gates 4a are depicted in FIG. 2B and should possess very high on-off ratio (typically 100–120 dB) to avoid any RF leakage through the gate to the sample. Further, the rise time of the gate should be very short, since pulses of the order of 10 to 20 nano sec are used in RF FT-EPR in contrast to pulses of tens of micro second or milli second in NMR. Even a two nano sec rise time will distort a 10 nano sec pulse from the desired square wave shape. Also, the gate opening and closing transients should be minimal to avoid any amplification by the power amp 7b. To meet these demands of ultra fast excitation needed for the RF FT-EPR, the special gates depicted in FIG. 2B have been designed and built.

The attenuators 5 are Kay Electronics model 839 and the pulse generator 6 is a cluster of Stanford Research Systems DG535 four channel digital delay/pulse generators; the RF Amplifier 7a is based on a 10–400 MHz modular amplifier, Motorola MHW 590; the RF Power Amplifier 7b is an ENI Model 5100L Watt, and the cross-diodes 8 are IN 4153 diodes. These cross diodes 8 disconnect the transmitter from the probe (tank circuit) and the preamplifier during the receiving mode to reduce the noise.

The diplexer 9 is depicted in FIG. 2C. A major requirement for a sensitive RF FT-EPR spectrometer is to design a suitable technique to couple the transmitter, probe and the receiver. During the transmit cycle high RF power of the transmitter should be delivered to the sample in the probe without damaging or overloading the sensitive receiver, and during the receiving mode any noise originating from the transmitter must be completely isolated. This is not trivial since the EPR signal of interest is in the microvolt range whereas the transmitter signal is hundreds of volt.

Further, in contrast to NMR, the very short relaxation time of EPR demands very fast closing and opening of these gates. In FIG. 2C, the diplexer gating pulse is generated by the pulse generator 6. The RF excitation pulse is received at Tx and is coupled to the probe by the diode switch when the diplexer gating pulse is asserted. Tx is isolated from the probe and Rx when the diplexer pulse is not asserted. A LAMBDA/4 cable protects the receiver during the transmit pulse and passes the signal during the receive period.

Figure 2D:
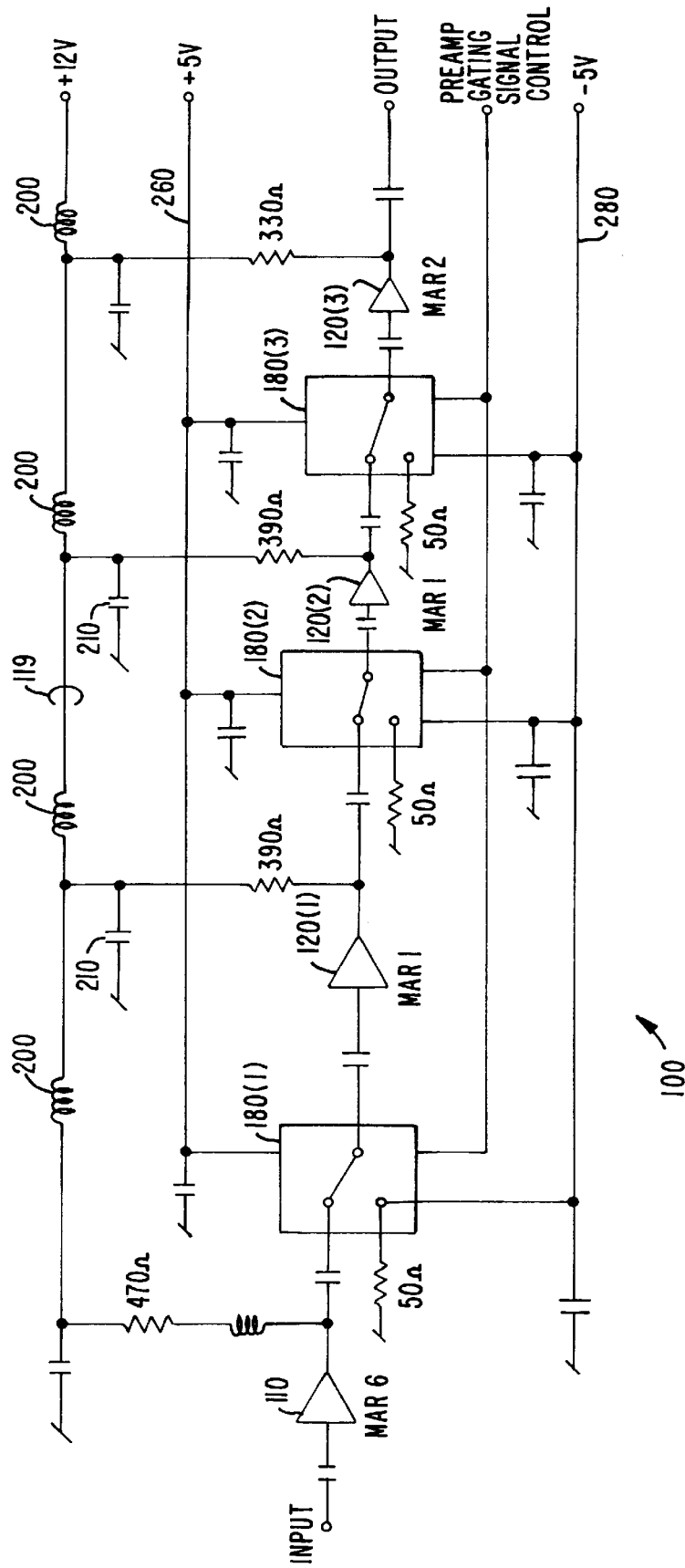
FIG. 2D is a schematic diagram of the gated preamp used in a preferred embodiment.

The gated preamplifier 10 is depicted in FIG. 2D and has a gain of 46 dB. An important problem faced in RF FT-EPR is the overload recovery of the receiver system, especially at the front end, viz, the preamplifier. Even small transients after the close of the Tx cycle or the ring down signals can easily overload and "paralyze" the preamplifier. Hence, the preamp should have a very fast rise time and high gain. Otherwise the weak FIDs can get distorted by the overload recovery problems. In NMR the recovery can be in micro seconds, but the short relaxation times of EPR demand nano second recovery. Otherwise a substantial amount of the useful signal is lost during the recovery of the receiver.

Specially designed cascaded amplifiers for high gain and fast recovery are needed, especially if the preamp can be gated; then the above mentioned transients following the Tx can be avoided. Since there is no suitable amplifier commercially available, a gated preamplifier 10 has been designed and built with a fairly wide bandwitdh (100 MHz), a gain of 14 dB, low noise and a very fast recovery time of 5 to 20 nano seconds. The gate of the preamp is opened after the transmitter pulse ringdown to avoid over load saturation. The gate pulse is provided by the pulse generator.

Amplifier 11 is a MITEQ Amplifier Model 2A0150

FIG. 2D is a schematic diagram of a preferred embodiment of the gated preamplifier. In FIG. 2D a gated preamplifier 100 includes an input stage 110 first, second, and third amplifications stages 120(1), 120(2), and 120(3) separated by first, second, and third GaAs switches 180(1), 180(2), and 180(3). Each amplification stage 120 is coupled to a twelve volt bias voltage line 190 including inductors 200 and bypass capacitors 210 to filter transients signals.

Each switch 180 is coupled to+5 volt and−5 volt supply lines 260 and 280 and to a control line 300. A first input terminal of each switch 180 is coupled to an output terminal of a previous amplification stage, a second input terminal of each switch 180 is coupled to a 50 Ohm impedance, and the output terminal of each switch 180 is capacitively coupled by a coupling capacitor 320 to the inverting input of a following amplification stage.

In operation, for each switch 180 a preamplifier gating signal (depicted in FIG. 3), asserted on the control line 300, connects the first input terminal to the output terminal when asserted and connects the second input terminal to the output terminal when not asserted.

When gated on, preamplifier gating signal asserted, the switches 180 introduce a small but negligible loss of signal amplitude between the amplification stages 120. When gated off, preamplifier gating signal not asserted, no amplification stage 120 will go into saturation because the attenuation between amplification stages 120 greatly exceeds the gain of each amplification stage 120. The amplitude of the output signal present during the transmit cycle is less than the amplitude of the output signal present during the receive cycle. The gain of each amplifier stage 120 is small (8 to 12 db) and the inputs are inverting to reduce transients introduced by the switches 180.

In a preferred embodiment the switches are VSW-2-50 DR switches with the typical isolation being about 50 dB and having a switching time of about 3 ns. The circuit elements have the following values:

coupling capacitors 320: 1 nF;

bypass capacitors 210: 33 nF;

inductors 200: 100 nH or ferrite beads.

The time constant associated with a resonant circuit is given by $$TAU = Q/PI*NU$$

Where NU is the resonance frequency following a Tx pulse of about 100 V into the resonant circuit, at least about 20 time constants are required for ringing down the decay to the level of small but measurable FID signal of about 2 micro volt. As seen from the above equation the ringdown time constant is inversely proportional to the frequency. In the case of EPR at conventional frequencies (9 GHz), this time constant is much lower than it is at the RF frequency.

Although TAU can be reduced by lowering the quality factor Q, the signal to noise ratio of the EPR signal is proportional to Q. Hence, Q cannot be compromised too much, especially so at low frequency where the signal to noise ratio is already limited by the Boltzmann factor. Also, this problem in RF FT-EPR is much more severe than the NMR due to the very short decay of the FID from the EPR signal. Hence, the resonator should have a short recovery time to collect the FID. Since the FID decays exponentially, even a small gain in the ringing time minimization can make large difference in acquiring the signal. We have adopted different approaches to solve this problem depending upon the sample of study.

Probes With Equal Subcoils In Parallel

Since high Q coils cannot be used at low frequencies we adopted other strategies to improve the sensitivity. The S/N ratio depends on other factors such as the filling factor (F) and volume (V) of the coil. This dependence is given by $$S/N = \sqrt{(F/QV)}$$

The coil volume was increased by adding solenoidal coil segments and wiring them in parallel[31]. This coil with segments in parallel has less inductance than a single coil of the same size and hence it is possible to make large size coil to accommodate more sample for a particular frequency.

We have reduced the Q to optimum values, depending upon the relaxation times of the free radical probes used, by overcoupling method rather than Q spoiling, since the signal intensity is greater in the overcoupling method by a factor of 2 as given by $$S \text{ overcoupled}/S \text{ spoiled} = \sqrt{(2\beta/1+\beta)}$$

where $\beta$ is the coupling constant.

Figure 2F:
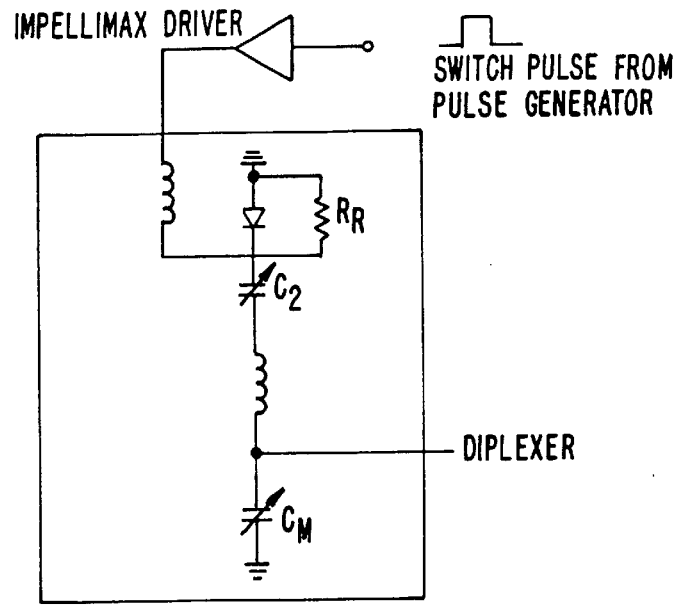
Figure 2F:
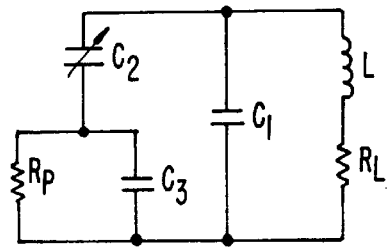

When sensitivity requirements demand high Q, dynamic Q-switching 36 can be used to cut down the resonator ringing time. Schematics of a Q-switching circuit are given in FIGS. 2E–F. The capacitor $c_2$ is used for tuning and $C_m$ for matching. A non magnetic PIN diode is used for Q-switching. In normal mode of operation $R_p$ is effectively the small forward bias resistance of the PIN diode. Q-switching is done by sending a short pulse (20 ns) immediately after the transmit RF pulse. During Q-switching $R_p$ is the large reverse bias resistance of the PIN diode in parallel with $R_R$. By selecting optimum $C_1$, $C_2$, $C_3$ and $R_p$, the total resistance of the network is maximized to minimize the ringdown time constant, $$TAUmin = 2L/(Rmax+RL)$$

where Rmax is given by $$Rmax = ((Rp)opt/2(C1/C2+1)2$$

Thus, during the switching pulse, the Q of the system gets low, thereby enabling faster ring down. However, after the switch pulse the Q becomes normal in the receive cycle for greater sensitivity.

Active Damping For Bandwidth Enlargement

To study relatively large size objects the bandwidth of excitation increases. In NMR, even a bandwidth of 70 KHz is relatively very large. However, in EPR a band width of 50–70 MHz may be needed. In principle, bandwidth enlargement can be achieved by placing a resistor in parallel with the tuned circuit. This passive damping, however, will degrade the signal. Hence, active damping 33, 34 can be used to enhance the band width and to bring down the ringing time. According to this procedure, a preamp with negative feedback is employed to enhance the bandwidth without seriously degrading the signal.

Other types of resonators such as loop-gap or bird-cage types are used. These are designed to have low Q and are matched by over coupling or active damping to enhance the band width and to bring down the ringing time.

One or two turn surface coils 35 are also used for topical applications where the size of the subject is too large to be accommodated inside the resonator Another type of resonator used is of a miniature catheter type 37 for angiographic applications.

Figure 2G:
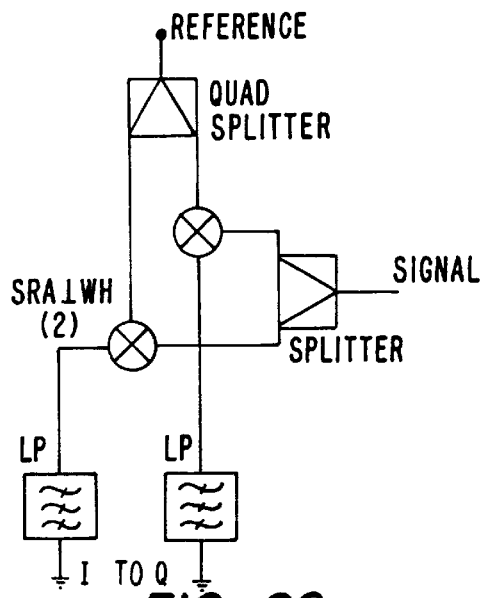
FIG. 2G is a schematic diagram of the quadrature detector used in a preferred embodiment.

The DC magnet 13 is a Magnet GMW Model 5451; the magnet power supply 14 is a Danfysik System 8000, Power Supply 858; the gradient coils 15 are (a) specially designed air cooled three axes gradient coils for 3D imaging and (b) surface gradient coils 38 for organ specific imaging. The gradient coils power supply 16 is an HP 6629A+specially designed microcomputer controlled relay system. The quad mixer 17 is depicted in FIG. 2G and the low pass filters 18a and b are specially designed.

Figure 2H:
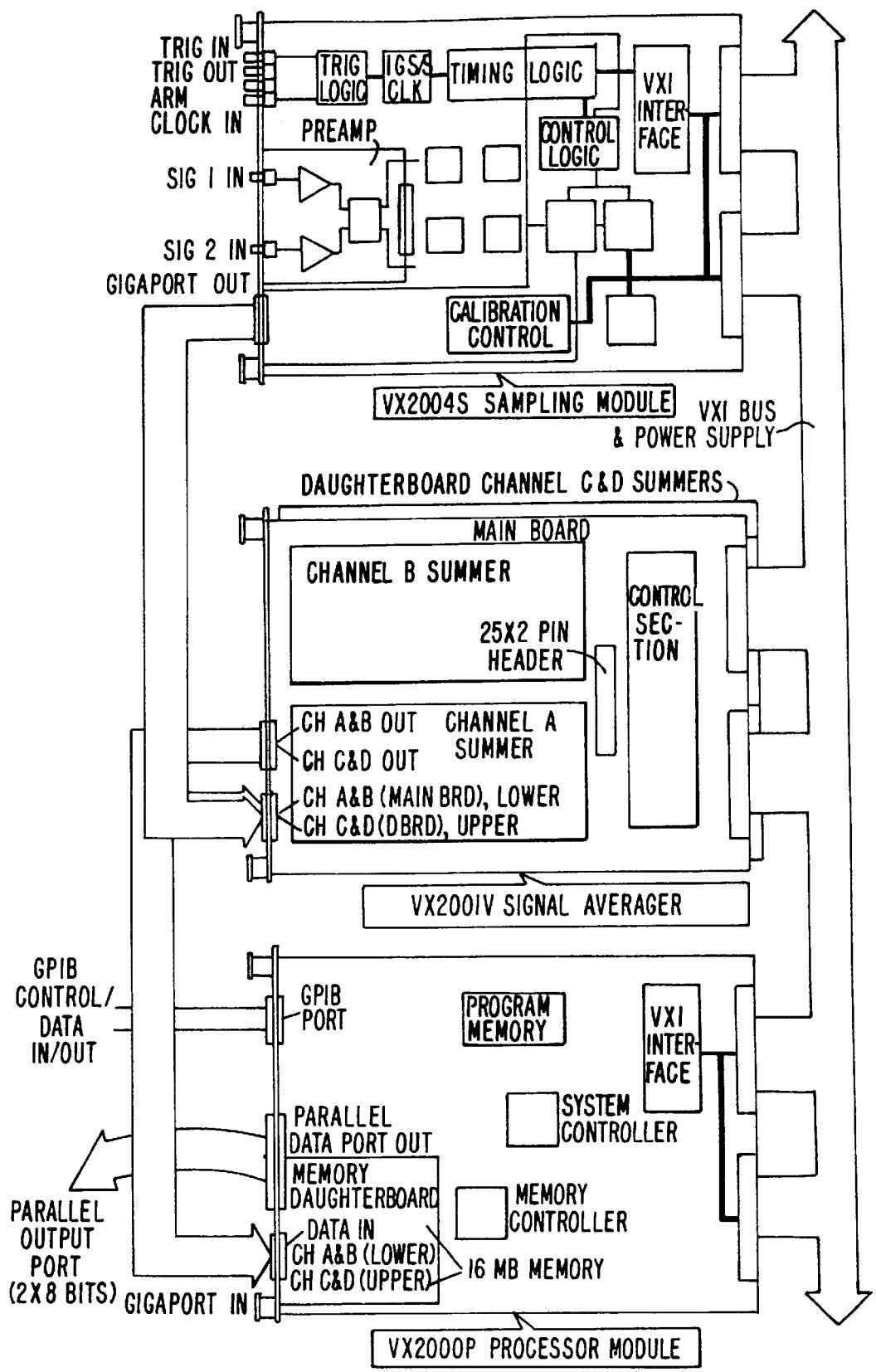
FIG. 2H is a layout diagram of the ultra-fast data acquisition subsystem used in the preferred embodiment.

The sampler/summer/averager 19 will now be described with reference to FIGS. 2H and I.

The magnetic induction response of the system of study to the exciting RF pulse is generally weak. To improve the signal to noise ratio it is necessary to carry out the signal averaging of the transient response. This is done by first digitizing and then summing the digitized data. The large line width (MHz in contrast to Hz or KHz in high resolution or solid state NMR) and the short relaxation times (nanoseconds in contrast to micro or milliseconds in NMR) encountered in EPR cause severe problems in the design and construction of suitably fast data acquisition systems for EPR imaging.

High speed digitizers with sampling frequencies up to even GHz range are now commercially available. However, these devices are generally suitable for capturing single shot events and the summing speed of the digitized data in these instruments for data accumulations is very slow. Such slowness prohibits one from taking advantage of the very short electron spin relaxation time and thereby limits the ability to improve the S/N ratio by carrying out a large number of coherent averages in a short period of time. Hence, we have utilized an ultra fast sampler/summer/averager to enhance the speed of data collection for imaging. As shown in the block diagram of this system in FIG. 2H, it consists of three modules: a sampler, a summer and a processor.

The sampler contains four high-precision TKA10C 500-MSPS analog to digital converters. It has a vertical resolution _of_ 8 bits, with a sensitivity of±250 mV full scale. The sampler also has an overload protection of±6 volts. The sampler has two channels with a maximum interleaved sampling rate of 1 GS/s per channel or 2 GS/s if it is used in a single channel mode.

The amplifier Plug_Ins provide gain, offset and calibration signal injection for the input signal and provide sufficient drive capability for the ADCs. The signals I and Q from the quad detector are shown as SIG1 and SIG2.

Calibration and correction circuitry are provided to correct AC and DC errors to be corrected at their source. A trigger controller provides triggering capability from the external source. In the Level Triggering mode, the triggering circuitry is enabled via when the ARM input which is at a TTL high level (given by the pulse generator) and the ACQUIRE signal has been received from the processor. The sampler then digitizes the data (FID) and sends it in eight parallel data streams (each at 250 MS/s) on the gigaport.

Figure 2I:
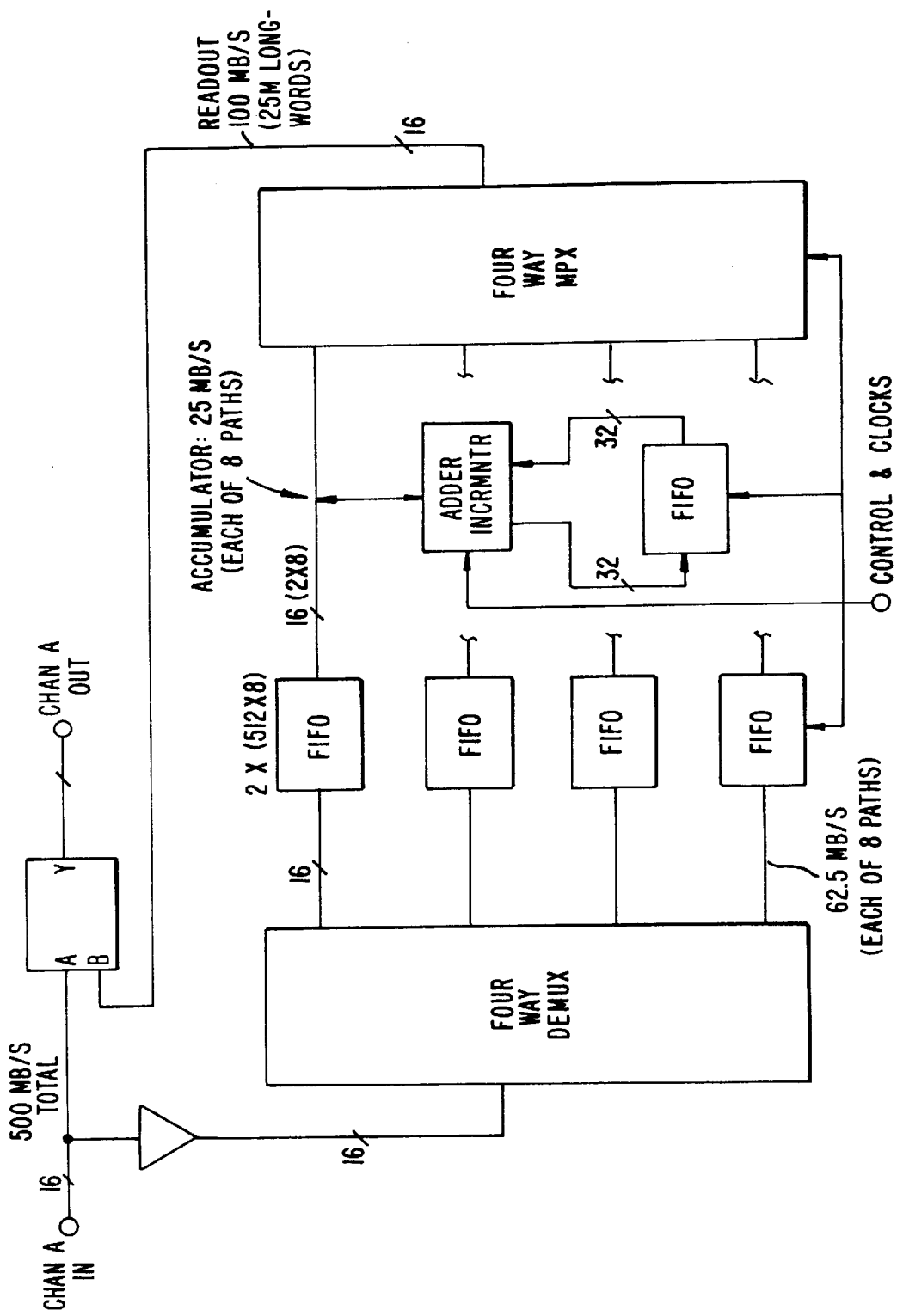
FIG. 2I is a block diagram of summing part of the ultra-fast data acquisition subsystem of FIG. 2H.

The gigaportout from the VX2004S sampling module provides data, clock and control and monitoring signals to the VX2001 signal averager. There are four channels, each providing 16 bit stream of data. Channels A and B provide the digitized data of signal 1 (Q-of the quadrature output) and C and D that of signal 2 (I of the quadrature output). The input FIFO (First-In-First-Out) memories buffer the data from the Giga-Ports. The FIFO memories can accommodate a record length of 8192 samples for each of two sampler channel pairs (A/B and C/D). A detailed block diagram for one of a channel is given in FIG. 2I.

The summing process begins when the processor activates a control signal 'P_ACQUIRE'. In response to this the summer/averager activates the sampler which in turn starts to send the digitized data over the four channels. The VX2001V sums the digitized waveform data words and then reactivates the sampler to initiate the next digitizing cycle. This process repeats until a programmed number of FIDs are summed. This programmable number is a 24 bit word and hence more than 4 million averages can be done without transferring the data to the processor.

The summation process operates in conjunction with the digitization process by the sampler when the sampler operates in Pre-Trigger mode. The summing process begins when the first words have been loaded into all of the input FIFO memories. Thus, the summing process effectively overlaps the digitization process since it does not have to wait until the input FIFO's loading process has been completed. FIDs with a record length of 1024 for both the signals at 1GSPS can be summed at a rate of 230 KHz. (retrigger period of approximately 4.3 ms.) The data output from the summer is 32 bits wide and passed in sequence to the VX2000P processor as two 16-bit words.

The VX2000P processor module contains:
- A Motorola 68340 micro-processor with the support of an integral 2-channel DMA controller, 4 MB DRAM, 128 KB EPROM, 2 MB Flash EEPROM, 2 integral timers and 2 serial I/O channels;
- an IEEE488.2 GPIB port for interface with host computer;
- a graphic processor with 2 MB of DRAM, 512 KB Of VRAM, a VGA compatible videoport providing 1024*768*4 graphics;
- two channels of data acquisition memory capable of acquiring data from the summer at a rate of 500 MB per second via the front panel Giga_Port connector; and
- a Giga-Port connector that supplies interfaces between the processor and the other modules;
- A high speed Parallel Output Port for the delivery of data to the external device (Host Computer/Image processor).

The large on board memory and the video graphics allow to collect an process more than 40 projections of data before down loading the data to the host computer.

Thus, the large band width of the sampler, the summing speed, the large dynamic range of the summer/averager, on-board data memory of 16 MB RAM and fast data transfer of the processor module provide an ultra fast DAS, enabling increased sensitivity and imaging in a short time.

The computer 20 is a Silicon Graphics IRIS-4D.

FIG. 3 is a timing diagram depicting the pulses generated by pulse generator 6 to control the various elements in the system of FIG. 1 for a one pulse experiment. A transmit gating pulse 30 is generated to control the high-speed gate to transmit an RF pulse having duration of about 10 to 70 nanoseconds. For larger samples the length of the pulse could be extended up to 100 nanoseconds.

The timing of the diplexer gating pulse 32 is best understand by considering the shape 34 of the RF pulse generated by the power amplifier 7a. The diplexer gating pulse 32 is asserted at the trailing edge of the transmit gating pulse 30. There is about a 25 nanosecond delay caused by the power amplifier 7a before the RF pulse reaches the diplexer. The diplexer gating pulse also extends about 30 nanoseconds beyond the end of the RF pulse. The receiver, preamp, and sampler/averager gating pulses 36, 38, and 40 are all asserted after a delay for ringdown recovery.

As described above, this timing is critical to keep the gated preamplifier 10 from saturating. The magnitude of RF pulse is much greater than the magnitude of the EPR response signal. Thus, any transients or glitches resulting from ringdown in the resonator would overwhelm the preamp 10 and cause saturation. Recovery from saturation in a cascaded amplifier is very slow and the system would become unoperational.

Thus, the recovery delay between the end of the RF pulse and the leading edge of the preamplifier gating signal allows for the transients to dissipate and prevents preamplifier 10 from saturating. The preamplifier 10 generates an EPR response signal with the information relating to EPR parameters.

The quadrature mixer 17 processes the EPR response signal to a lower frequency range for digitization.

As described above, in practice many transmit pulses are generated and the corresponding EPR responses summed to improve the signal to noise ratio. Typically, the transmit gating pulses 30 are generated at a repetition rate of 4 to 5 microseconds. This allows summing between pulses which takes about 4 microseconds.

The pulse sequence for stochastic excitation or pseudo stochastic excitation is depicted in FIGS. 4C and 4B. This excitation sequence with subsequent Hadamard transformation or cross correlation will be used where a large bandwidth is to be excited, in place of a high power pulse. This will avoid sample heating considerably, because the power required for stochastic excitation is at least two orders of magnitude less than in the conventional pulsed techniques. The principle and application of stochastic excitation is well documented and illustrated in NMR spectroscopy and imaging literature.23–28

The rf carrier is pulsed and modulated by a pseudo random binary sequence, as depicted in FIG. 4A, which is generated in a shift register or a computer program. The values of the sequence are used to modulate the rf phase for each sampling interval DELTA(T) between 0° and 180°, as depicted in FIG. 4B. The pseudo-noise sequence thus generated will be repeated in a cyclic fashion after a given number of values. The acquisition of the response and phase cycling follow standard procedures. A Hadamard transform or cross correlation of the response produces the FID which, upon complex Fourier transform, yields a spectrum or a single projection when gradients are present.

Figure 5:
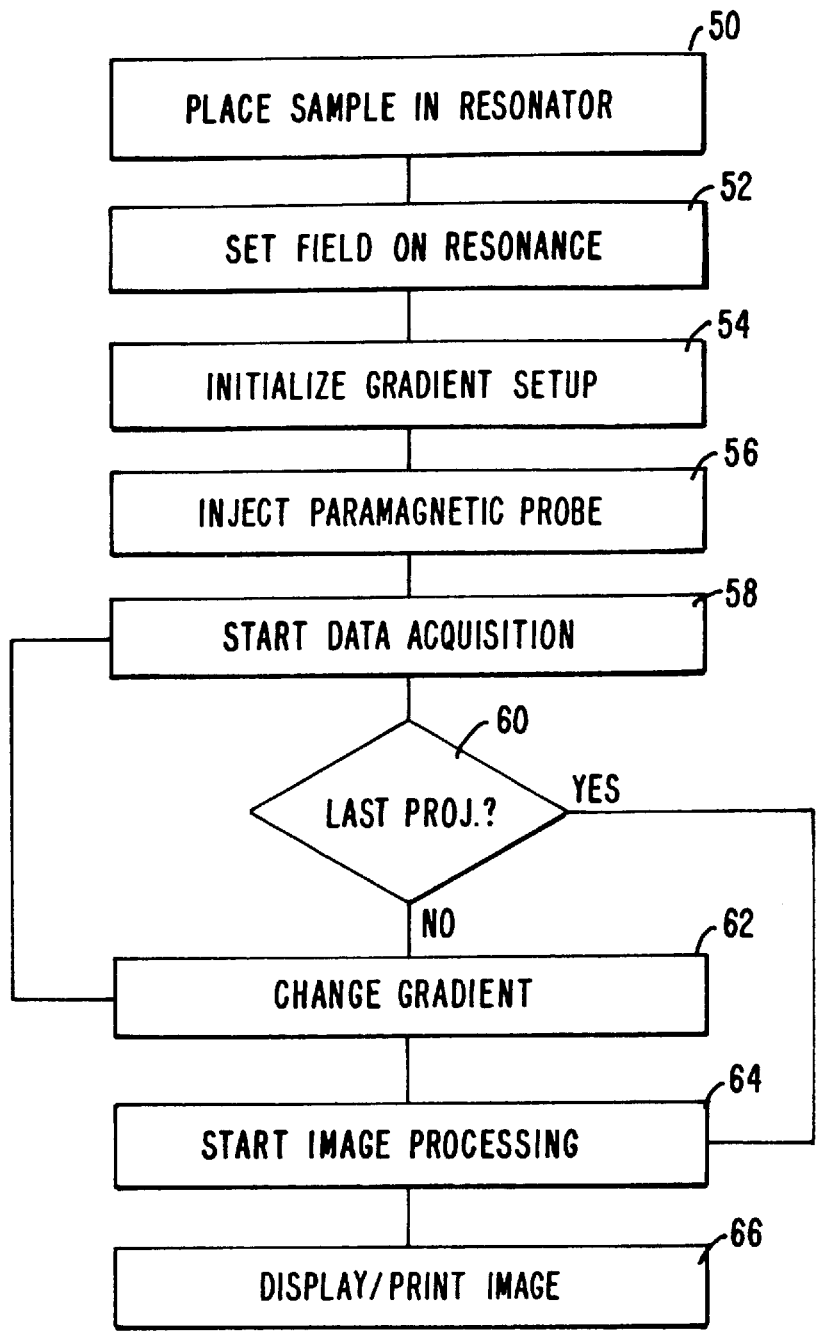
FIG. 5 is a flow chart giving the details of generating an image.

FIG. 5 is a flow chart depicting the steps required to utilize the system of FIG. 1 to perform in vivo imaging of a sample.

The sample is placed in the resonator 50 and fields are set up 52, 54 to cause the molecules to be imaged to resonate at a selected low frequency of about 300 MHz.

In many cases, a paramagnetic probe may be injected 56 into the sample to improve imaging parameters. For example, if oxygen tension of the sample is to be measured the paramagnetic probe selected will interact with oxygen to increase the relaxation rate. If short-lived free radicals are to be imaged a spin trapping agent may be injected.

Subsequently, data acquisition will be started 58. A series of 10 to 60 nanosecond RF pulses having a repetition rate of 4 to 5 microseconds will be used induce resonance in the sample. The receiver arm, gated by pulses from the pulse generator 6, will detect, amplify, demodulate, sample, digitize, and sum, EPR parameters in the time periods between RF pulses.

Various projections will be imaged by changing the gradient field 60, 62 and then image processing will be started 64 and the acquired image will displayed or printed 66.

Similar steps (excluding the injection of a probe), utilizing small resonators and large gradients, can be used to perform FT EPR microscopy, especially in devices involving distribution of paramagnetic centers, such as semiconductor wafers, Lagmuir-Blodgett films, quality control of conducting polymers and non-destructive determination of stress or deterioration of polymeric substances in industry, commercial, and biomedical environment.

The invention has now been described with reference to the preferred embodiments. Alternatives and substitutions will now be apparent to persons of skill in the art. For example, although particular GaAs switches have been described other switches with similar or improved characteristics can be substituted. The gain and attenuation factors can be scaled for different operating conditions as is known in the art. Additionally, the amplifiers and switches can be implemented using printed circuit with discrete components, hybrid technology, or as in integrated circuit. Accordingly, the it is not intended to limit the invention except as provided by the appended claims.

What is claimed is:

1. A gated RF preamplifier for utilization in a data acquisition subsystem characterized by a transmit cycle during which an RF excitation pulse of high amplitude is followed immediately by a receive cycle and data acquisition period, where said excitation pulse excites a sample and causes the sample to radiate a low amplitude data signal, with the imaging system asserting a gating signal during said receive cycle, said preamplifier comprising:

a plurality of amplification stages, each stage having an inverting input port for receiving an input signal and an output port for providing an amplified output signal;

a like plurality of switches, with each switch in said plurality having an input terminal coupled to the output of a preceding amplification stage, a first output terminal coupled to the input of a succeeding amplification stage, a second output terminal coupled to a terminating impedance, and each switch having a control input to receive said gating signal, each switch for coupling its input terminal to its first output terminal when the gating signal is asserted, and for coupling its input terminal to its second output terminal when the gating signal is not asserted so that said data signal passes from the preceding to the succeeding amplifier when said gating signal is asserted and so that the data signal is highly attenuated and each amplification stage is terminated when the gating signal is not asserted; and a biasing network for continuously providing a bias voltage to said amplification stages while the gating signal is asserted to provide quick response to an input signal transmitted by one of said switches.

2. The preamplifier of claim 1 where said imaging system is a magnetic resonance imaging system and the data signal is an FID signal.

3. The preamplifier of claim 1 where said amplification stages are monolithic RF amplifiers.

4. The preamplifier of claim 1 wherein said switches are GaAs switches.

5. The preamplifier of claim 1 where each amplification stage has a predetermined gain and each switch has a predetermined attenuation factor when switched off and wherein the attenuation factor of the amplifier when switched off greatly exceeds the gain when switched on.

6. The preamplifier of claim 1 where each switch has a switching time of about 3 to 20 nanoseconds.

7. The preamplifier of claim 1 where said switches and amplification stages are implemented in hybrid technology.

8. The preamplifier of claim 1 where said switches and amplification stages are implemented in an integrated circuit.

* * * * *